US012439831B2

United States Patent
Yan et al.

(10) Patent No.: US 12,439,831 B2
(45) Date of Patent: Oct. 7, 2025

(54) SPIN CURRENT AND MAGNETORESISTANCE FROM THE ORBITAL HALL EFFECT

(71) Applicants: YEDA RESEARCH AND DEVELOPMENT CO. LTD., Rehovot (IL); YISSUM RESEARCH DEVELOPMENT COMPANY OF THE HEBREW UNIVERSITY OF JERUSALEM LTD., Jerusalem (IL)

(72) Inventors: Binghai Yan, Rehovot (IL); Jiewen Xiao, Rehovot (IL); Amir Capua, Jerusalem (IL)

(73) Assignees: YEDA RESEARCH AND DEVELOPMENT CO. LTD., Rehovot (IL); YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 389 days.

(21) Appl. No.: 18/042,212

(22) PCT Filed: Aug. 19, 2021

(86) PCT No.: PCT/IL2021/051014
§ 371 (c)(1),
(2) Date: Feb. 19, 2023

(87) PCT Pub. No.: WO2022/038611
PCT Pub. Date: Feb. 24, 2022

(65) Prior Publication Data
US 2023/0309411 A1      Sep. 28, 2023

(30) Foreign Application Priority Data
Aug. 20, 2020   (IL) .......................... 276842

(51) Int. Cl.
*H10N 50/85*    (2023.01)
*H10N 50/20*    (2023.01)
*H10N 50/80*    (2023.01)

(52) U.S. Cl.
CPC ............. *H10N 50/85* (2023.02); *H10N 50/20* (2023.02); *H10N 50/80* (2023.02)

(58) Field of Classification Search
CPC ........ H10N 50/10; H10N 50/20; H10N 50/80; H10N 50/85
See application file for complete search history.

(56) References Cited

U.S. PATENT DOCUMENTS

2017/0178705 A1    6/2017  Buhrman et al.
2018/0350498 A1*  12/2018  Kazemi .................. H10N 52/80
2019/0348329 A1   11/2019  Shiokawa et al.

FOREIGN PATENT DOCUMENTS

EP           3382767 A1     10/2018
WO    WO-2014025838 A1 *  2/2014  ............. G11C 11/16
(Continued)

OTHER PUBLICATIONS

Avci et al. "Unidirectional spin Hall magnetoresistance in ferromagnet/normal metal bilayers" Nature Physics. Jul. 2015;11(7):570-5.
(Continued)

*Primary Examiner* — Yu Chen
(74) *Attorney, Agent, or Firm* — Mark S. Cohen; PEARL COHEN ZEDEK LATZER BARATZ LLP

(57) ABSTRACT

Devices for sensing and manipulating magnetic fields based on spin current interactions independent of the Spin Hall Effect (SHE) in heavy metal. Spin current is generated in ordinary metals by conversion of out-of-plane orbital current arising from the Orbital Hall Effect (OHE). The conversion from orbital current to spin current takes place in a thin layer of heavy metal (several atomic layers thick), thereby substantially reducing heavy metal requirements by replacing (Continued)

heavy metal with ordinary metal. Device applications include magnetoresistive sensors for detecting and measuring magnetic fields, and magnetic tunnel junction data storage units.

4 Claims, 5 Drawing Sheets

(56) References Cited

FOREIGN PATENT DOCUMENTS

| WO | WO2016/021468 | | 2/2016 |
|---|---|---|---|
| WO | WO-2017048229 A1 | * | 3/2017 |
| WO | WO2018/155077 | | 8/2018 |

OTHER PUBLICATIONS

Bernevig et al. "Orbitronics: The intrinsic orbital current in p-doped silicon" Physical review letters. Aug. 1, 2005;95(6):066601.
Bhowal et al. "Intrinsic orbital moment and prediction of a large orbital Hall effect in two-dimensional transition metal dichalcogenides" Physical Review B. Mar. 18, 2020;101(12):121112.
Büttiker M. "Four-terminal phase-coherent conductance" Physical review letters. Oct. 6, 1986;57(14):1761.
Büttiker M. "Role of quantum coherence in series resistors" Physical Review B. Mar. 1, 1986;33(5):3020.
Buttiker M. "Symmetry of electrical conduction" IBM Journal of Research and Development. May 1988:32(3):317-34.
Canonico et al. "Orbital Hall insulating phase in transition metal dichalcogenide monolayers" Physical Review B. Apr. 29, 2020;101(16):161409.
Go et al. "Intrinsic spin and orbital Hall effects from orbital texture" Physical Review Letters. Aug. 24, 2018;121(8):086602.
Go et al. "Torque generation by orbital current injection" Physical review research. Feb. 20, 2020;2(1):013177.
Guo et al. "Ab initio calculation of the intrinsic spin Hall effect in semiconductors" Physical review letters. Jun. 8, 2005;94(22):226601.
Huang et al. "Transport magnetic proximity effects in platinum" Physical review letters. Sep. 7, 2012;109(10):107204.
International Search Report for PCT Application No. PCT/IL2021/051014 dated Nov. 16, 2021.
Jo et al. "Gigantic intrinsic orbital Hall effects in weakly spin-orbit coupled metals" Physical Review B. Dec. 4, 2018;98(21):214405.
Jungwirth et al. "Spin Hall effect devices" Nature materials. May 2012;11(5):382-390.
Kane et al. "Quantum spin Hall effect in graphene" Physical review letters. Nov. 23, 2005;95(22):226801.
Kato et al. "Observation of the spin Hall effect in semiconductors" science. Dec. 10, 2004;306(5703):1910-3.
Kontani et al. "Giant Intrinsic Spin and Orbital Hall Effects in Sr 2 M O 4 (M=Ru, Rh, Mo)" Physical review letters. Mar. 7, 2008;100(9):096601.
Kontani et al. "Giant orbital Hall effect in transition metals: Origin of large spin and anomalous Hall effects" Physical review letters. Jan. 6, 2009;102(1):016601.
Liu et al. "Chirality-driven topological electronic structure of DNA-like materials" Nature materials. May 2021;20(5):638-44.
Murakami et al. "Dissipationless quantum spin current at room temperature" Science. Sep. 5, 2003;301(5638):1348-51.
Nagaosa et al. "Anomalous hall effect" Reviews of modern physics. May 13, 2010;82(2):1539.
Saitoh et al. "Conversion of spin current into charge current at room temperature: Inverse spin-Hall effect" Applied physics letters. May 1, 2006;88(18):182509.
Sinova et al. "Universal intrinsic spin Hall effect" Physical review letters. Mar. 25, 2004;92(12):126603.
Stamm et al. "X-ray spectroscopy of current-induced spin-orbit torques and spin accumulation in Pt/3 d-transition-metal bilayers" Physical Review B. Jul. 23, 2019;100(2):024426.
Tanaka et al. "Intrinsic spin Hall effect and orbital Hall effect in 4 d and 5 d transition metals" Physical Review B. Apr. 11, 2008;77(16):165117.
Tokatly IV. "Orbital momentum Hall effect in p-doped graphene" Physical Review B. Oct. 7, 2010;82(16):161404.
Valenzuela et al. "Direct electronic measurement of the spin Hall effect" Nature. Jul. 13, 2006;442(7099):176-9.
Weiler et al. "Local charge and spin currents in magnetothermal landscapes" Physical review letters. Mar. 5, 2012;108(10):106602.
Wunderlich et al. "Experimental observation of the spin-Hall effect in a two-dimensional spin-orbit coupled semiconductor system" Physical review letters. Feb. 4, 2005;94(4):047204.
Xiao et al. "Berry phase effects on electronic properties" Reviews of modern physics. Jul. 6, 2010;82(3):1959.
Zhao et al. "Coherence control of Hall charge and spin currents" Physical review letters. Jun. 19, 2006;96(24):246601.
Bernevig et al. "Quantum spin Hall effect and topological phase transition in HgTe quantum wells" science. Dec. 15, 2006;314(5806):1757-61.
Phong et al. "Optically controlled orbitronics on a triangular lattice" Physical Review Letters. Dec. 6, 2019;123(23):236403.

* cited by examiner

SPIN CURRENT AND MAGNETORESISTANCE FROM THE ORBITAL HALL EFFECT

CROSS-REFERENCE TO RELATED APPLICATIONS

This application is a National Phase Application of PCT International Application No. PCT/IL2021/051014, International Filing Date Aug. 19, 2021, claiming priority from IL Patent Application No. 276842, Filed Aug. 20, 2020 which is hereby incorporated by reference.

FIELD OF THE INVENTION

The present invention relates to the field of spin transport electronics, and, in particular, to the conversion of orbital current associated with the Orbital Hall Effect to spin current.

BACKGROUND OF THE INVENTION

The field of spin transport electronics (also known as spin electronics or spintronics) has a number of practical applications, non-limiting examples of which include magnetoresistance devices for reading magnetically-encoded data storage media; and magnetoresistive random-access memory for computers.

The Spin Hall Effect (SHE) has been exploited for electrically-manipulating electron spin in a variety of spintronics applications. Spin current involves an alignment of intrinsic electron spin, and has a specified orientation. Notable materials which exhibit strong SHE behavior are the heavy metals.

Currently, Spin Hall Effect devices rely on heavy metals to provide spin current. In some cases, however, it is desirable to reduce the dependence on heavy metals by utilizing ordinary metals to provide spin current in devices, while reducing the extent of heavy metal required. This goal is met by embodiments of the present invention.

SUMMARY OF THE INVENTION

Embodiments of the present invention provide devices for sensing and manipulating magnetic fields based on spin current interactions independent of the Spin Hall Effect (SHE) in heavy metal. According to various embodiments of the invention, spin current is generated by conversion of out-of-plane orbital current arising from the Orbital Hall Effect (OHE) in ordinary metals. The OHE does not rely on spin-orbital coupling and orbital currents are produced in ordinary metals.

The term "heavy metal" herein denotes metallic elements having 5 d electron shells, particularly including, but not limited to: Platinum (Pt); Tungsten (W); and Tantalum (Ta). In contrast, the term "ordinary metal" herein denotes metallic elements lacking 5 d electron shells and having at most 3 d or 3 d/4 d electron shells, or lacking d subshells altogether. Ordinary metals particularly include, but are not limited to: Copper (Cu); and Aluminum (Al). Heavy metals exhibit strong spin-orbital coupling (SOC), whereas ordinary metals exhibit weak spin-orbital coupling.

Orbital current involves an alignment of the orbital motion of atomic electrons and is distinct from the intrinsic spin of the electron. Orbital current has a specified orientation. Embodiments of the invention provide conversion from orbital current to spin current via thin layers of heavy metal, typically only several atomic layers thick (in the nanometer range) capping ordinary metal planar components, thereby substantially reducing heavy metal requirements by replacing most of the heavy metal with ordinary metal. The term "capping" herein denotes that the thin layers adjoin the surfaces of the metal planar components and are in electrical contact therewith. As disclosed herein, non-limiting applications for devices according to the present invention include magnetoresistive sensors for detecting and measuring magnetic fields, and magnetic tunnel junction data storage.

"Charge current" herein refers to the flow of electric charges in a conductor, as encountered in ordinary electrical circuits.

Thus, embodiments of the present invention substantially reduce the requirements for heavy metals by utilizing ordinary metals to provide orbital current, and then converting the orbital current to spin current using a minimal extent of heavy metal.

Therefore, in an embodiment of the present invention there is provided a device for generating a spin current, the device including: (a) a planar component for generating an out-of-plane orbital current via Orbital Hall Effect (OHE) of an in-plane charge current flow within the planar component, (b) wherein the planar component is substantially constituted of an ordinary metal lacking a 5 d electron shell; (c) a layer of a heavy metal in electrical contact with a face of the planar component, for converting the out-of-plane orbital current to an out-of-plane spin-current, (d) wherein the heavy metal has a 5 d electron shell.

BRIEF DESCRIPTION OF THE DRAWINGS

The subject matter disclosed may best be understood by reference to the following detailed description when read with the accompanying drawings in which.

Figure 1:
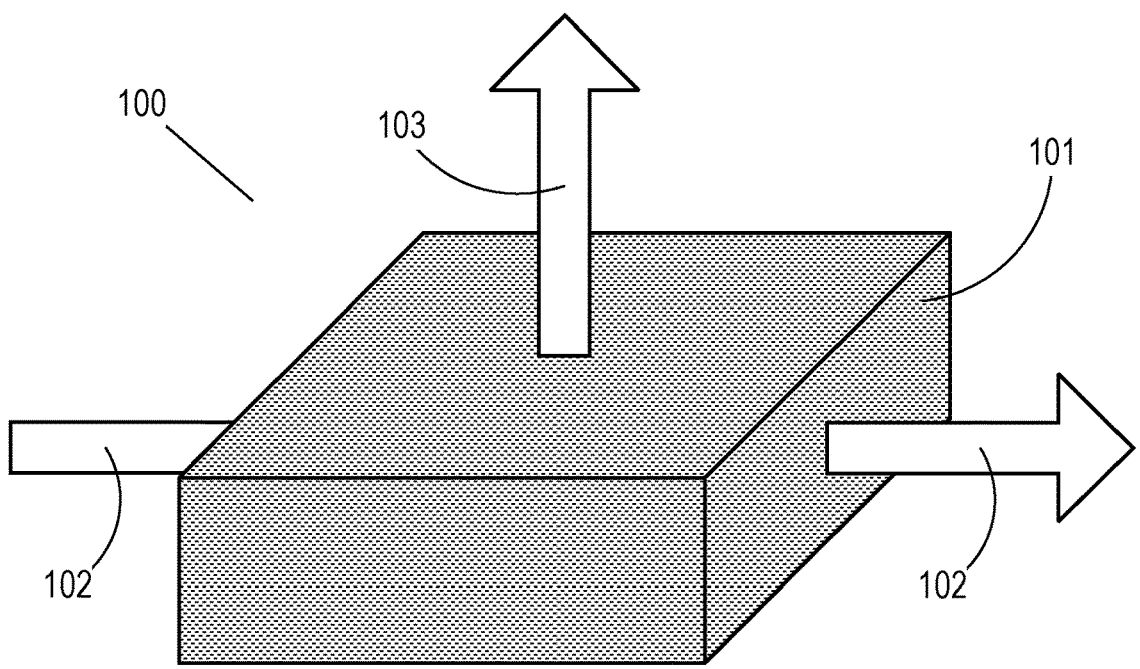
FIG. 1 conceptually illustrates a prior-art device configuration utilizing a heavy metal planar component for providing an out-of-plane spin current from an in-plane charge current.

For simplicity and clarity of illustration, items shown in the figures are not necessarily drawn to scale, and the dimensions of some items may be exaggerated relative to other items. In addition, reference numerals may be repeated among the figures to indicate corresponding or analogous items.

DETAILED DESCRIPTION OF THE PRESENT INVENTION

FIG. 1 conceptually illustrates a prior-art device configuration 100 utilizing a heavy metal planar component 101 for generating an out-of-plane spin current 103 from an in-plane charge current 102 flowing through heavy metal planar component 101. As noted previously, Platinum, Tungsten, and Tantalum are often used as the heavy metal for planar component 101.

The term "planar component" herein denotes a three-dimensional component with at least one face which is substantially in the form of a plane and which has a surface area sufficient for adjoining to a corresponding face of another component. A planar component has an "in-plane" axis which lies inside the component and is oriented parallel to the surface of the face, and an "out-of-plane" axis which is at least partly outside the component and is oriented perpendicular to the surface of the face. Charge current flow direction within a planar component is herein referenced to the in-plane axis of the planar component; spin current orientation and orbital current orientation are herein referenced to the out-of-plane axis of the planar component.

Figure 2:
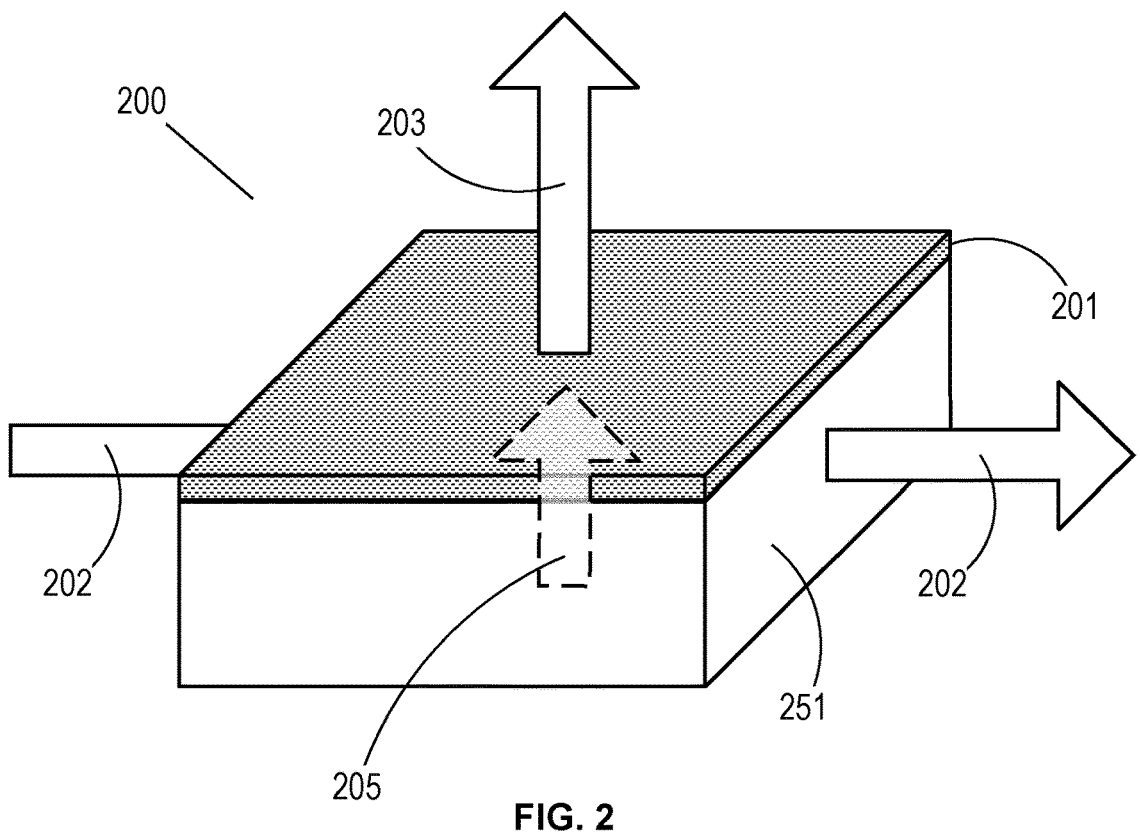
FIG. 2 conceptually illustrates a device component configuration according to an embodiment of the present invention, in which the extent of heavy metal is substantially reduced, and in which the metal planar component for providing out-of-plane spin current is constituted substantially of ordinary metal through which the in-plane charge current flows.

FIG. 2 conceptually illustrates a device component configuration 200 according to an embodiment of the present invention, in which the extent of heavy metal is substantially reduced to a thin layer 201. A metal planar component 251 is made of ordinary metal and constitutes most of the bulk of device 200, such that layer 201 is in electrical contact with the top face of planar component 251. According to the present invention, in-plane charge current 202 flowing through ordinary metal 251 generates an out-of-plane orbital current 205 via the Orbital Hall Effect (OHE), and thin layer 201 converts out-of-plane orbital current 205 into out-of-plane spin current 203 via spin-orbital coupling. In a related embodiment, heavy metal layer 201 is only a few atoms thick—a total thickness of 1 nanometer is typically sufficient. (As noted previously, the drawings are not intended to be at scale, and thin layer 201 is exaggerated in size in the drawings for clarity.) Thus, by utilizing ordinary metal for conducting charge current 202, embodiments of the present invention provide a substantial reduction in the amount of heavy metal required to generate out-of-plane spin current. In other embodiments, Copper and Aluminum are used for ordinary metal 251.

Figure 3:
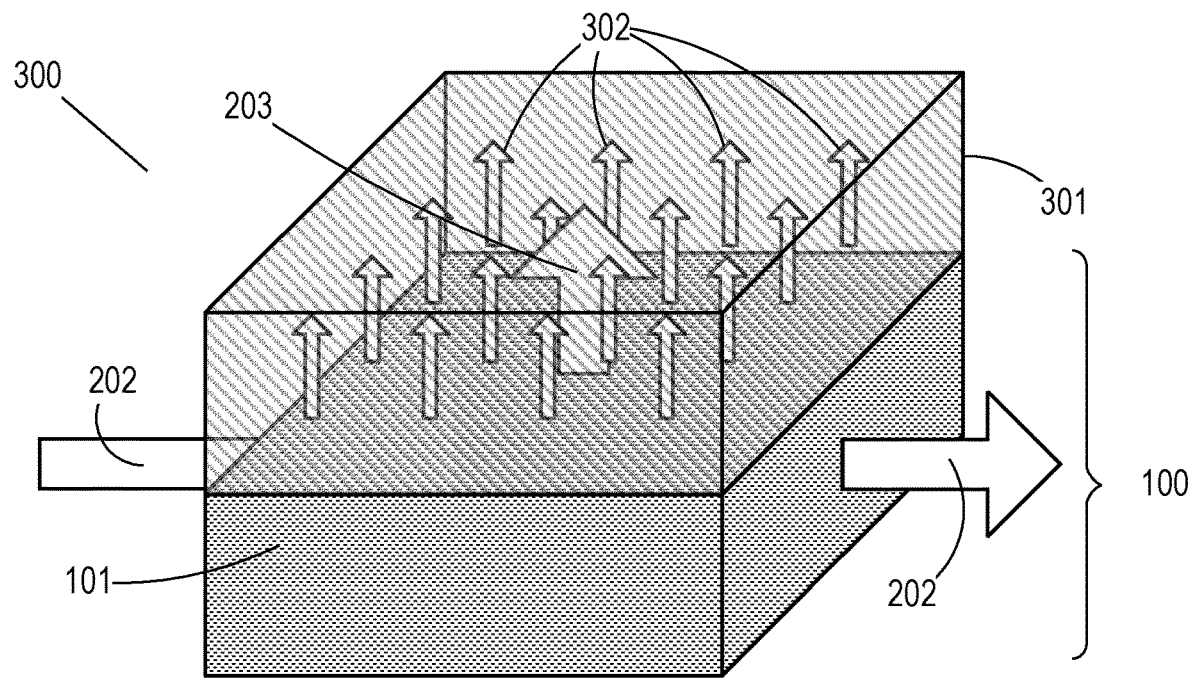
FIG. 3 conceptually illustrates a prior-art device configuration utilizing a heavy metal planar component for providing an out-of-plane spin current from an in-plane charge current.

FIG. 3 conceptually illustrates a prior-art device configuration 300 utilizing heavy metal planar component 101 for providing out-of-plane spin current 203 from in-plane charge current 202, as illustrated in FIG. 1. In this embodiment, out-of-plane spin current 203 controls magnetic field orientation 302 of a permanent magnet 301 situated above heavy-metal planar component 101.

Figure 4:
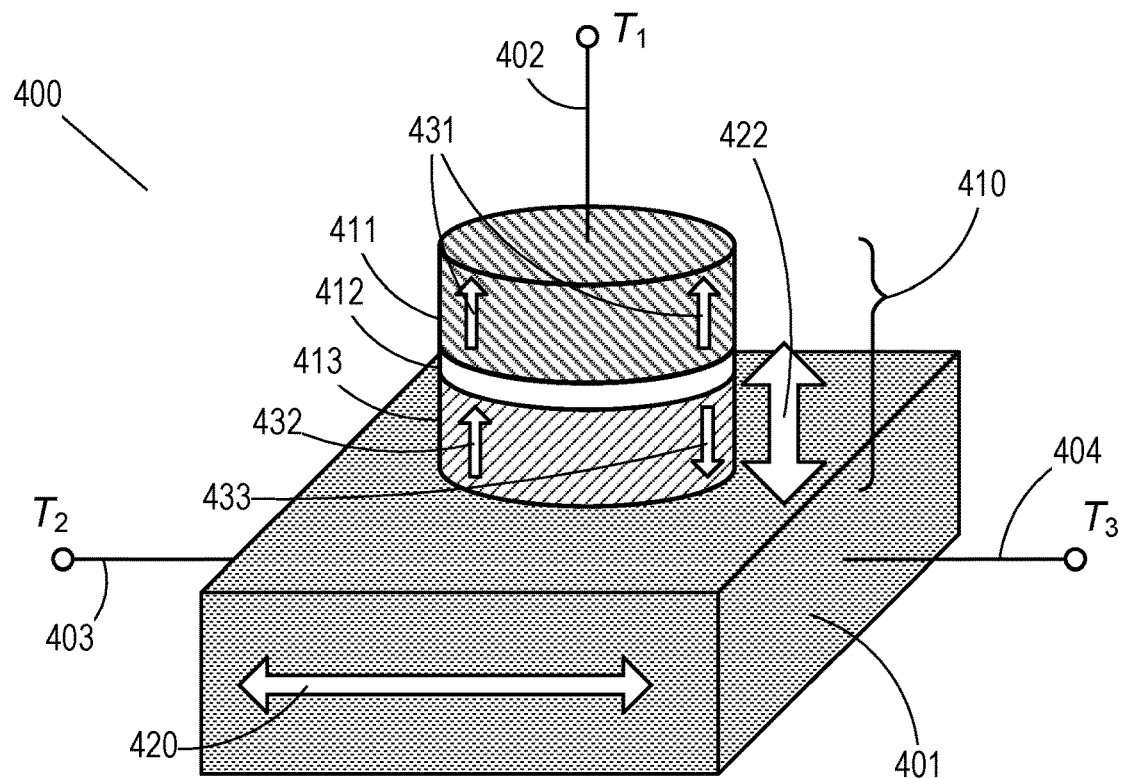
FIG. 4 conceptually illustrates a prior-art magnetic tunneling junction device which is switched by an out-of-plane spin current provided by a heavy metal planar component.

FIG. 4 conceptually illustrates a prior-art three-terminal magnetic tunneling junction device 400. A magnetic tunneling junction 410 (MTJ) incorporates a ferromagnetic reference layer 411 above a thin insulating layer 412, below which is a ferromagnetic free layer 213. Insulating layer 412 is typically only a few nanometers thick, so that electrons can tunnel through insulating layer 412 and pass between reference layer 411 and free layer 413. Reference layer 411 remains magnetized in a direction 431, but the magnetization of free layer 413 can be switched between a direction 432 (which is parallel to direction 431) and a direction 433 (which is anti-parallel to direction 431). When free layer 413 is magnetized in direction 432 parallel to direction 431, electrons tunnel with high statistical probability across insulating layer 412, thereby establishing a low resistance electrically-conductive path between reference layer 411 and free layer 413. However, when free layer 413 is magnetized in direction 433 anti-parallel to direction 431, electrons tunnel with low statistical probability across insulating layer 412, thereby establishing a high electrical resistance between reference layer 411 and free layer 413. Thus, switching the magnetization direction of free layer 413 effectively switches MTJ 410 between an electrically-conducting state and a substantially non-conducting state. In device 400, switching the magnetization direction of free layer 413 is accomplished by switching an out-of-plane spin current 422 provided by a heavy metal planar component 401 as a result of an in-plane charge current 420 injected through heavy metal planar component 401 in response to the Spin Hall Effect. The direction of charge current flow 420 governs the direction of out-of-plane spin current 422, and hence controls the conductivity state of MTJ 410. A first electrical terminal $T_1$ 402 connects to reference layer 411; a second electrical terminal $T_2$ 403 connects to one side of heavy metal planar component 401; and a third electrical terminal $T_3$ 404 connects to the other side of heavy metal planar component 401. Thus, the magnitude and direction of in-plane charge current 420 are given by the electrical current flowing between terminal $T_2$ 403 and terminal $T_3$ 404. The conductivity state of MTJ 410 can be detected externally by sensing the electrical resistance between terminal $T_1$ 402 and either of terminal $T_2$ 403 or terminal $T_3$ 404. A non-limiting application of device 400 is for data storage, where a single bit of data can be represented by the conductivity state of MTJ 410. The bit is written by passing a pulse of current between terminal $T_2$ 403 and terminal $T_3$ 404 in a left-or-right direction according to the desired bit value to be written; and the bit is read by sensing the electrical resistance between terminal $T_1$ 402 and either of terminal $T_2$ 403 or terminal $T_3$ 404.

Figure 5:
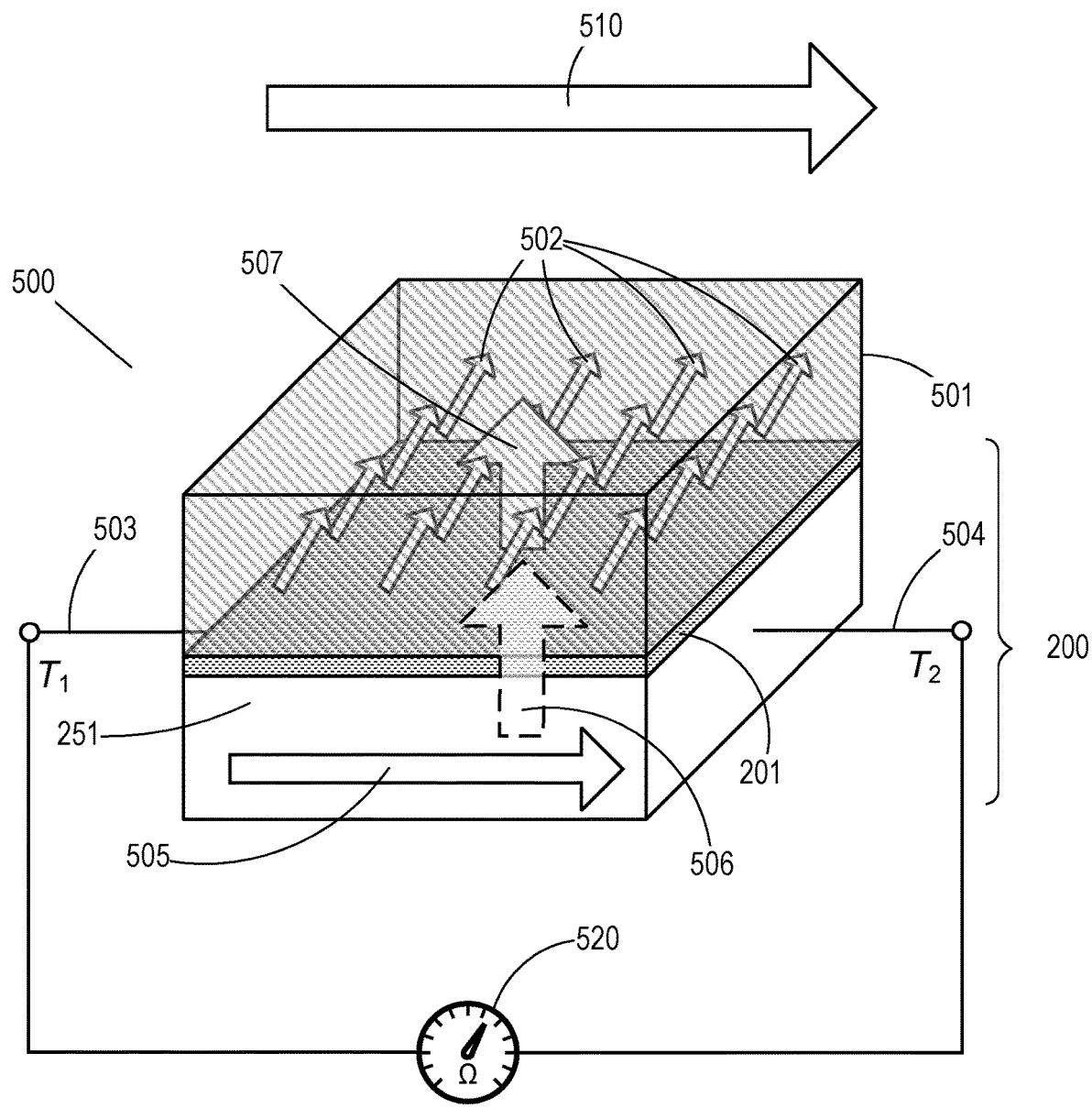
FIG. 5 conceptually illustrates a magnetic field sensor device according to an embodiment of the present invention for detecting and measuring the rotation of a permanent magnetic field by an external magnetic field.

FIG. 5 conceptually illustrates a two-terminal device 500 according to an embodiment of the present invention for detecting and measuring the rotation of a permanent magnetic field 502 in a ferromagnetic material 501 by an external magnetic field 510. In a non-limiting example, external magnetic field 510 corresponds to a state of a magnetic data storage medium, and the device illustrated in FIG. 5 and described herein reads data from the magnetic data storage medium.

This embodiment provides a magnetic field sensor, described as follows: As illustrated in FIG. 2 and disclosed herein above, a planar component 251 of ordinary metal is capped with a thin layer 201 of heavy metal (only a few atomic layers thick). In FIG. 5 are shown a first electrical terminal $T_1$ 503 connected to one side of planar component 251 and a second electrical terminal $T_2$ 504 connected to the other side of planar component 251 which allow sensing the electrical resistance of planar component 251 when an in-plane charge current 505 passes through the ordinary metal of planar component 251 and establishes an out-of-plane orbital current 506. Because of the high spin-orbital coupling of layer 201, orbital current 506 is coupled to an out-of-plane spin current 507. Spin current 507 is affected by rotated magnetic field 502, which in turn affects coupled orbital current 506, and this in turn affects in-plane charge current 505. The affect on in-plane charge current 505 is detected and measured by measuring the electrical resistance in ohms (Ω) across terminals $T_1$ 503 and $T_2$ 504, such as with electrical resistance-measuring apparatus 520. Since rotation of magnetic field 502 is a function of the strength and orientation of external magnetic field 510, the strength and orientation of external magnetic field 510 may also be measured in terms of the electrical resistance across terminals $T_1$ 503 and $T_2$ 504 (such as with apparatus 520), and hence the device of FIG. 5 provides a magnetic field sensor.

Figure 6A:
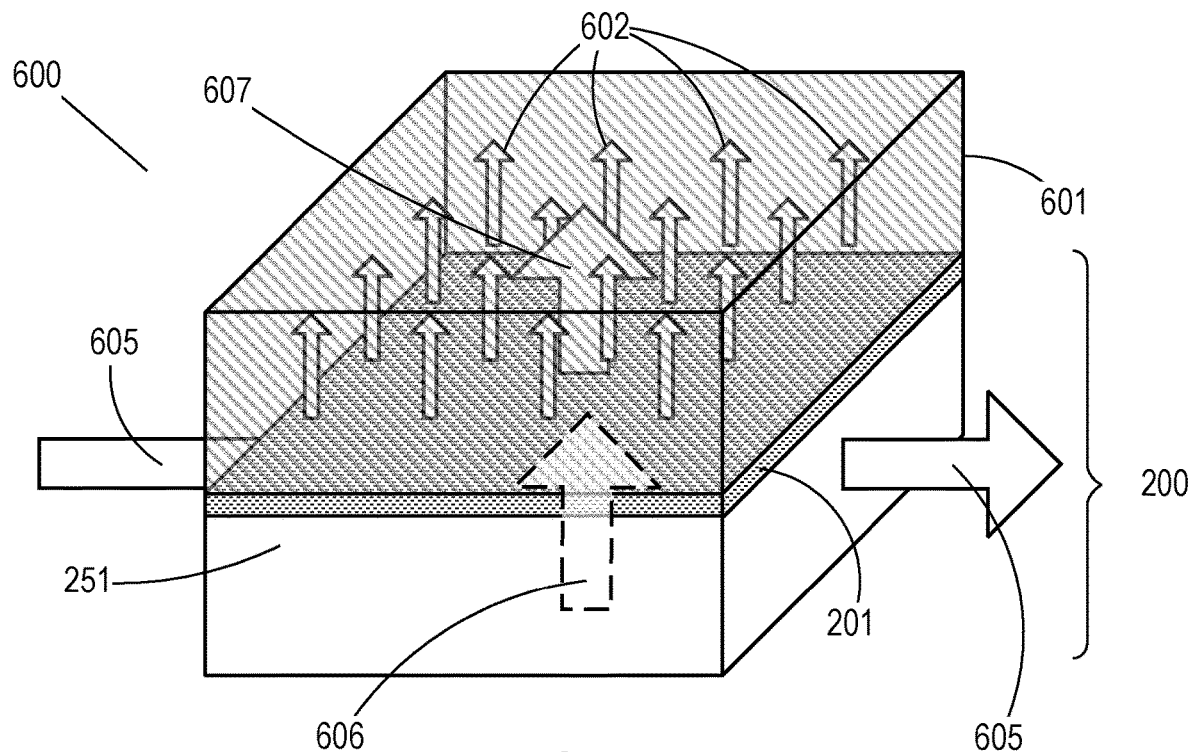
FIG. 6A conceptually illustrates establishing a magnetic field having a first orientation in a permanent magnet by a device according to an embodiment of the present invention.

FIG. 6A conceptually illustrates establishing a magnetic field 602 having an upward orientation in a permanent magnet 601 by a device 600 according to an embodiment of the present invention. When an in-plane charge current 605 flows through ordinary metal planar component 251 in a left-to-right direction, an out-of-plane orbital current 606 is established, oriented in an upward direction through heavy metal layer 201. Heavy metal layer 201 converts orbital current 606 into an out-of-plane spin current 607, also oriented in an upward direction. Out-of-plane spin current 607 in turn creates magnetic field 602 likewise oriented in an upward direction.

Figure 6B:
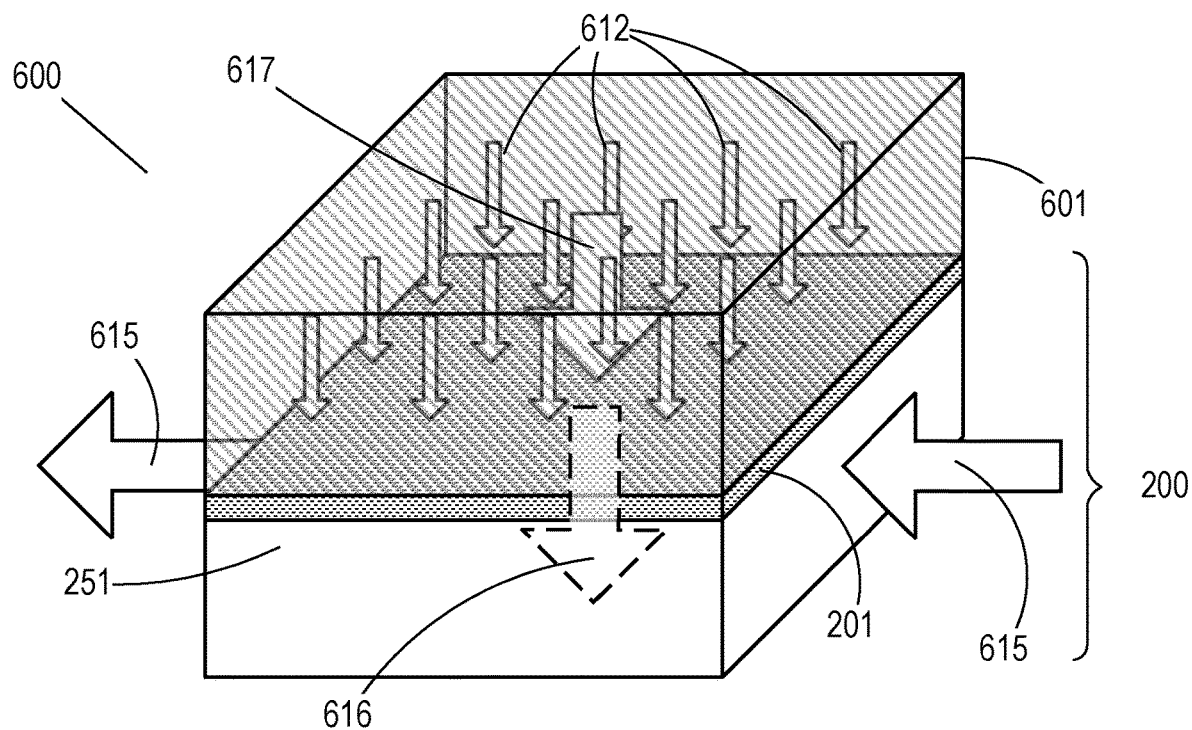
FIG. 6B conceptually illustrates establishing a magnetic field having a second orientation in the permanent magnet of the device of FIG. 6A, according to the embodiment.

FIG. 6B conceptually illustrates establishing a magnetic field 612 having a downward orientation in permanent magnet 601 by device 600 according to this same embodiment. When an in-plane charge current 615 flows through ordinary metal planar component 251 in a right-to-left direction, an out-of-plane orbital current 616 is established, oriented in downward direction through heavy metal layer 201. Heavy metal layer 201 converts orbital current 616 into an out-of-plane spin current 617, also oriented in a downward direction. Out-of-plane spin current 617 in turn creates magnetic field 612 likewise oriented in a downward direction.

Figure 7:
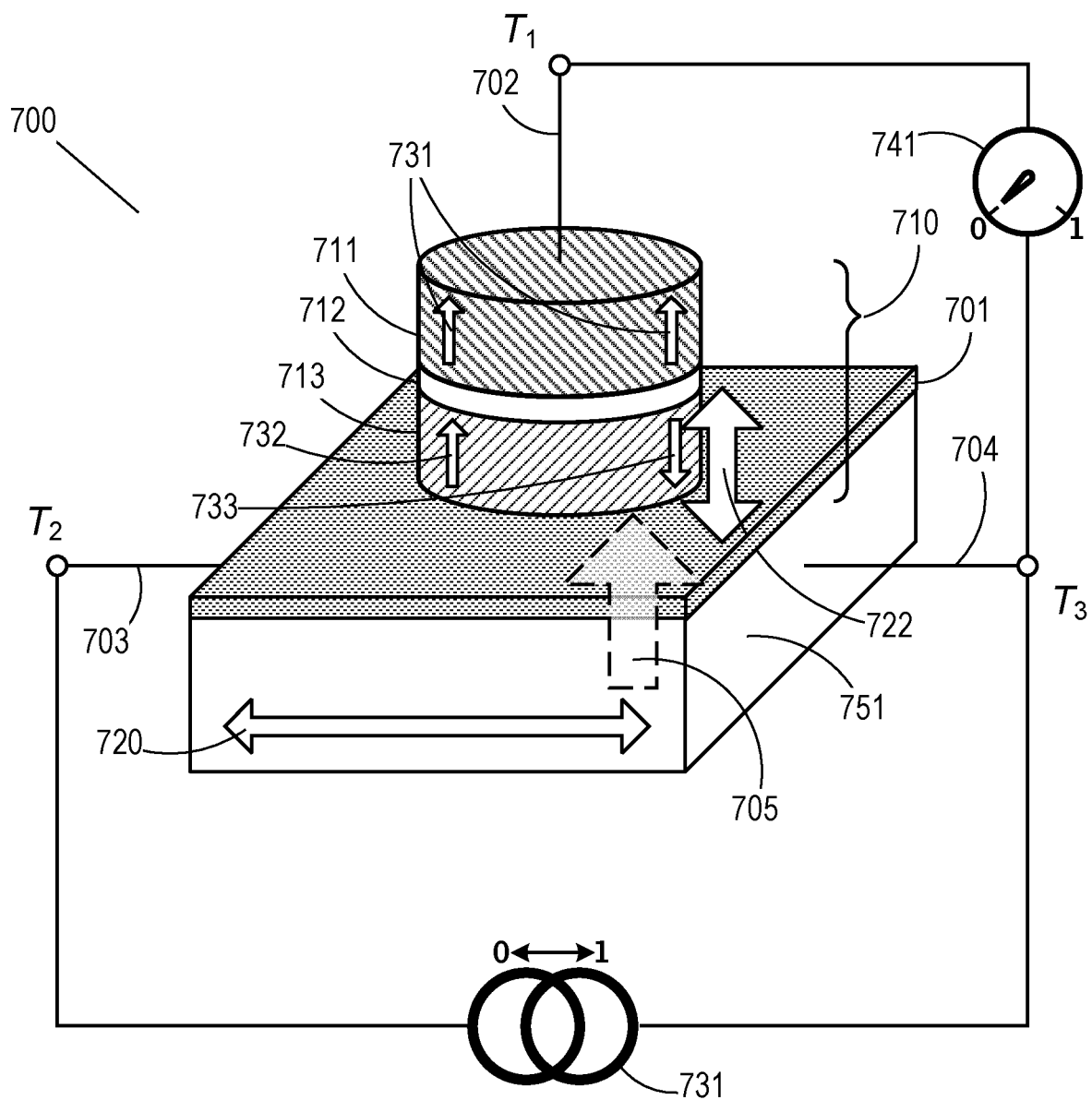
FIG. 7 conceptually illustrates a magnetic tunneling junction device switched by an out-of-plane orbital-to-spin current conversion according to an embodiment of the present invention.

FIG. 7 conceptually illustrates a magnetic tunneling junction device 700 switched by an out-of-plane orbital-to-spin current conversion according to an embodiment of the present invention. MJT 710 incorporates a ferromagnetic reference layer 711 above a thin insulating layer 712, below which is a ferromagnetic free layer 713. Insulating layer 712 is typically only a few nanometers thick, so that electrons can tunnel across it between reference layer 711 and free layer 713. Reference layer 711 remains magnetized in a direction 731, but the magnetization of free layer 713 can be switched between a direction 732 (which is parallel to direction 731) and a direction 733 (which is anti-parallel to direction 731). When free layer 713 is magnetized in direction 732 parallel to direction 731, electrons tunnel with high statistical probability across insulating layer 712, thereby establishing a low resistance electrically-conductive path between reference layer 711 and free layer 713. However, when free layer 713 is magnetized in direction 733 anti-parallel to direction 731, electrons tunnel with low statistical probability across insulating layer 712, thereby establishing a high electrical resistance between reference layer 711 and free layer 713. Thus, switching the magnetization direction of free layer 713 effectively switches MTJ 710 between an electrically-conducting state and a substantially non-conducting state.

Device 700 as illustrated in FIG. 7 and described herein according to this embodiment of the present invention is notably distinct over similar device 400 of FIG. 4, in that the switching mechanism of FIG. 7 includes an ordinary metal planar component 751 capped by a thin heavy metal layer 701, and in that an injected charge current 720 flows substantially through ordinary metal rather than heavy metal, thereby substantially replacing heavy metal with ordinary metal. Whereas device 400 relies on the Spin Hall Effect in heavy metal planar component 401 for generating spin current 422, device 700 does not rely on the Spin Hall Effect, but instead utilizes the Orbital Hall Effect in ordinary metal planar component 751, and then converts a resulting out-of-plane orbital current 705 into an out-of-plane spin current 722 via a thin heavy metal layer 701.

A non-limiting application of device 700 is for data storage, where a single bit of data can be represented by the electrical conductivity state of MTJ 710.

A first electrical terminal $T_1$ 702 is connected to reference layer 711; a second electrical terminal $T_2$ 703 is connected to one side of ordinary metal planar component 751; and a third electrical terminal $T_3$ 704 is connected to the other side of ordinary metal planar component 751. Thus, the magnitude and direction of in-plane charge flow 720 is controlled by the electrical current flowing between terminal $T_2$ 703 and terminal $T_3$ 704, such as from a bi-directional electrical source 731, which changes direction of the current to selectably write the data bit value of 0 or 1. The conductivity state of MTJ 710 can be detected externally by sensing the electrical conductivity between terminal $T_1$ 702 and either of terminal $T_2$ 703 or terminal $T_3$ 704, such as by an electrical conductivity detector 741, which detects the data bit value. The single bit is written by passing a pulse of current between terminal $T_2$ 703 and terminal $T_3$ 704 in a left-or-right direction according to the desired bit value to be written; and the single bit is read by determining the electrical conductivity state of MTJ 710, such as by sensing the electrical resistance between terminal $T_1$ 702 and either of terminal $T_2$ 703 or terminal $T_3$ 704.

It is noted that the assignment of bit values to electrical conductivity states is arbitrary, and that a bit value of 1 can be logically assigned to either the MTJ conducting state or the MTJ non-conducting state. The bit values shown in FIG. 7 are for illustrative purposes only and are non-limiting.

What is claimed is:

1. A device for generating a spin current, the device comprising:

a planar component for generating an out-of-plane orbital current via Orbital Hall Effect (OHE) of an in-plane charge current flow within the planar component, wherein the planar component is an ordinary metal lacking a 5d electron shell;

a layer of a heavy metal in electrical contact with a face of the planar component, for converting the out-of-plane orbital current to an out-of-plane spin-current, wherein the heavy metal has a 5d electron shell;

a ferromagnetic component above the heavy metal layer;

two electrical terminals connected to different sides of the planar component; and electrical resistance measuring apparatus connected between the two electrical terminals.

2. The device of claim 1, wherein the ordinary metal is selected from a group consisting of: Copper; and Aluminum.

3. The device of claim 1, wherein the heavy metal is selected from a group consisting of: Platinum; Tungsten; and Tantalum.

4. The device of claim 1, wherein the device is operative to detect and measure an external magnetic field that rotates a magnetic field in the ferromagnetic component.

* * * * *